United States Patent
Collin et al.

(10) Patent No.: US 7,013,115 B2
(45) Date of Patent: Mar. 14, 2006

(54) METHOD FOR THE GENERATION OF MODULATION BY FREQUENCY DIVISION FOLLOWED BY FREQUENCY MULTIPLICATION, AND RADIOFREQUENCY APPARATUS

(75) Inventors: Laurent Collin, Paris (FR); Pierre-Henri Boutigny, Melun (FR); Denis Triquenaux, Versailles (FR)

(73) Assignee: Thales, Paris (FR)

( * ) Notice: Subject to any disclaimer, the term of this patent is extended or adjusted under 35 U.S.C. 154(b) by 593 days.

(21) Appl. No.: 10/132,203

(22) Filed: Apr. 26, 2002

(65) Prior Publication Data

US 2003/0040289 A1   Feb. 27, 2003

(30) Foreign Application Priority Data

Apr. 27, 2001 (FR) .................................. 01 05730

(51) Int. Cl.
*H04B 1/04* (2006.01)
(52) U.S. Cl. ....................... 455/110; 455/112; 455/116; 375/279
(58) Field of Classification Search ............... 455/110, 455/112, 115.1, 116, 118, 67.11; 375/279, 375/233
See application file for complete search history.

(56) References Cited

U.S. PATENT DOCUMENTS

| 4,613,976 | A | * | 9/1986 | Sewerinson et al. | ........ 375/279 |
| 5,729,182 | A | | 3/1998 | Fousset et al. | |
| 5,745,843 | A | * | 4/1998 | Wetters et al. | .............. 455/112 |
| 5,903,609 | A | | 5/1999 | Kool et al. | |
| 5,905,413 | A | * | 5/1999 | Yoshida et al. | ............. 455/110 |
| 6,026,307 | A | | 2/2000 | Blom et al. | |
| 6,181,955 | B1 | * | 1/2001 | Dartois | ....................... 455/112 |
| 6,345,173 | B1 | * | 2/2002 | Fourtet et al. | .............. 455/113 |
| 2004/0121731 | A1 | * | 6/2004 | Walker | ....................... 455/102 |

FOREIGN PATENT DOCUMENTS

EP    0 369 832    5/1990

* cited by examiner

*Primary Examiner*—Lana Le
(74) *Attorney, Agent, or Firm*—Oblon, Spivak, McClelland, Maier & Neustadt, P.C.

(57) ABSTRACT

Method and radiofrequency apparatus comprising at least one transmitter and/or one receiver of one or more useful signals comprising at least one device adapted to applying a coefficient to the useful signal or signals. Application to BPSK to QPSK type modulation.

12 Claims, 6 Drawing Sheets

METHOD FOR THE GENERATION OF MODULATION BY FREQUENCY DIVISION FOLLOWED BY FREQUENCY MULTIPLICATION, AND RADIOFREQUENCY APPARATUS

BACKGROUND OF THE INVENTION

1. Field of the Invention

The present invention relates to a radiocommunications apparatus comprising means suited to the application of a coefficient to one or more useful signals.

The expression "useful signal" hereinafter designates an information-carrier signal.

The coefficient may be a multiplication coefficient or, again, a division coefficient.

The radiocommunications apparatus comprises, for example, a transmitter and/or a receiver, at least one of these two devices comprising the division and/or multiplication means.

It can be applied to phase modulation and/or frequency modulation.

It relates especially to radiocommunications apparatuses (using wireless beams, unicast links, and unicast-multicast links etc) working in the millimeter frequency band.

2. Description of the Prior Art

In radiocommunications apparatuses, the transmission system generally comprises a device to transpose the frequency of the information-carrying useful signal into a radiofrequency band. The frequency $F_{ol}$ of the local oscillator is therefore of the same magnitude as the transmission frequency $F_e$. This entails the development of functions in frequency ranges, especially in the millimeter range, that are difficult to attain.

There are also known transmission systems where the frequency multiplication step is performed on the signal that has undergone frequency transposition.

SUMMARY OF THE INVENTION

The idea of the invention is based on the structure of a transmitter and/or receiver that integrates devices adapted to the application of a coefficient to one or more useful signals.

Furthermore, the structure comprises means adapted to improving the symmetry of the power spectral density obtained by this method. It optimizes the baseband modulating signals to filter the power spectral density of the initial modulating signal at transmission.

The object of the invention relates to a radiofrequency apparatus comprising at least one transmitter and/or one receiver of one or more useful signals, wherein the apparatus comprises at least one modulator adapted to the modulation of the useful signal or signals at a frequency $F_m$, $F_{mv}$, a device adapted to the division of the modulated signal or signals by a coefficient $K_1$, $K_2$, a device to transpose the modulated and divided signal or signals into a frequency $F_r$, a device to multiply the modulated, divided and transposed signal or signals by a coefficient N in order to obtain a signal at a transmission frequency $F_e$.

It comprises for example a divider integrated into the modulator.

According to another embodiment, the equipment comprises at least one divider device positioned after the modulator.

According to another embodiment, the equipment comprises at least one divider device positioned after the modulator.

It may comprise a device for the random generation of a formant, which can be adapted to produce a formant enabling the optimizing of the phase states during the modulation of the useful signal and/or ensuring a random sense of phase rotation.

The radiofrequency apparatus is for example a transmitter comprising at least one of the above-mentioned characteristics and a device for transposing the frequency of the modulated and divided signals, located between the divider and the multiplier.

The invention also relates to a method for the transmission of one or more useful signals comprising at least the following steps:

Modulating the useful signal or signals at a frequency $F_m$, $F_{mv}$,

Dividing the modulated useful signal or signals by a coefficient $K_1$, $K_2$,

Transposing the modulated and divided signal or signals $S'_3$ into a frequency $F_r$, Multiplying the modulated, divided and transposed signal or signals by a coefficient N in order to obtain a signal at this transmission frequency $F_e$.

It may comprise at least one step for the precoding of the useful signal or signals wherein the sense of the phase rotation to meet the different points of the constellation of the phase states of the modulation is determined randomly.

The paths and the senses of phase rotation to go to the different points of the constellation chosen are for example randomly distributed between the different states in order to obtain the most symmetrical possible spectrum after frequency division and frequency multiplication.

The path is determined for example to modify the power spectral density, especially in order to reduce the level of the minor lobes of the spectral density of the useful signal.

The sense of phase rotation is determined by random draw after the path to be taken has been determined.

The modulation of the useful signal is carried out for example by a vector modulator enabling modulation at constant amplitude.

The method can be applied for example to a BPSK or QPSK type modulation.

The invention offers especially the following advantages:

The simplification of the architecture of the high frequency part of a transmission system.

The use of a minimum quantity of components in the radiofrequency part of the transmitter, for example.

Precision in the initial modulation which is of the same magnitude as the precision required in the modulation after multiplication if the ratio of division on the initial modulation is identical to the multiplication ratio.

The transposition of the modulation at output of the divider enabling an increase in the frequency of the useful signal divided before it is multiplied it and therefore the obtaining, at output of the multiplier, of a transmission signal towards the microwave or millimeter frequency ranges with a reasonable multiplication ratio.

An optimization of the symmetry of the spectrum emitted and a filtering of the power density of the useful signal by optimizing the formant of the signals in phase and in quadrature of the modulator carrying out the initial modulation.

BRIEF DESCRIPTION OF THE DRAWINGS

Other advantages and characteristics of the invention shall appear more clearly from the following description, given by way of an illustration that in no way restricts the scope of the invention, with reference to the appended drawings, of which.

MORE DETAILED DESCRIPTION

In order to provide for a clearer understanding of the object of the invention, the following description, given by way of an illustration that in no way restricts the scope of the invention, pertains to a transmission system of a radiofrequency apparatus incorporating a device adapted to performing a frequency division of the useful signal and a device adapted to performing a frequency multiplication of the useful signal that has undergone frequency division and transposition.

Figure 1:
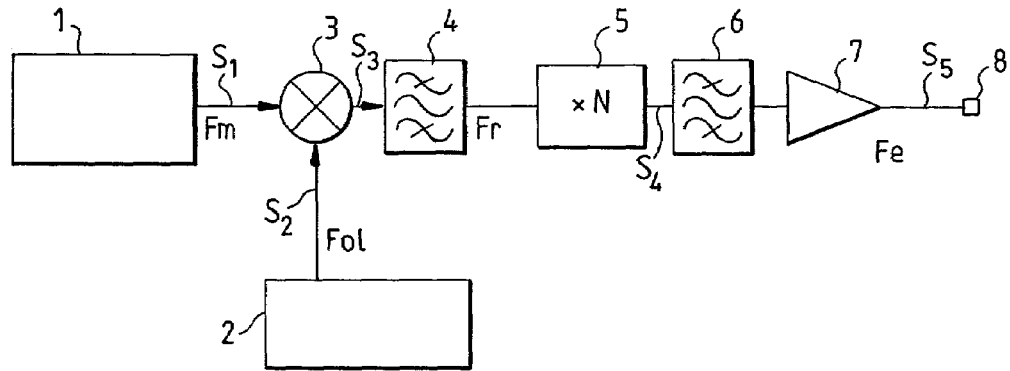
FIG. 1 is a drawing of the transmission system comprising a prior art multiplication device.

FIG. 1 shows an exemplary transmission system of a radiofrequency apparatus including a device for the frequency multiplication of the useful signal.

The system comprises a modulator 1 giving a useful, information-carrier signal $S_1$ that is phase modulated and has a frequency $F_m$, a local oscillator 2 at a frequency $F_{ol}$ and a mixer 3. This mixer 3 receives the modulated useful signal and a signal $S_2$ at the frequency $F_{ol}$ in order to mix them and produce a signal $S_3$ at a frequency $F_r$ that is equal or substantially equal to $(F_m+F_{ol})$ or $(F_m-F_{ol})$. This frequency-transposed signal $S_3$ is sent to a bandpass filter 4 and then to a device 5 adapted to the multiplication of this signal $S_3$ by a coefficient N so as to produce a signal $S_4$ at the transmission frequency $F_e$ (with $F_e=N(F_{ol}+F_m)$ or $F_e=N(F_{ol}-F_m)$). The multiplied signal is then sent to a second bandpass filter 6 and then to an amplifier 7 by which it is given the power sufficient for it to be transmitted at the antenna output 8 as the signal $S_5$.

Should the useful signal at the output of the antenna be a signal at the frequency $F_e$ modulated by phase jumps $i*(2*\pi/m)$ corresponding to the encoding of the digital data to be transmitted, where m is the number of states of the phase modulation, the phase jumps at the antenna are equal to:

$$i \times \frac{2\pi}{m} \text{ with } i \in [0, \ldots, m-1], \text{ or} \quad (1)$$
$$\pm(2i+1) \times \frac{\pi}{m} \text{ with } i \in [0, \ldots, (m/2)-1]$$

The coefficient m is a function of the modulation to be sent. If $m=2^r$, where r is a coefficient depending on the phase modulation used, we have, for example BPSK (Bit Phase Shift Keying) modulation for r=1 and m=2 and QPSK (Quadrature Phase Shift Keying) for r=2 and m=4.

This phase modulation is the phase modulation achieved at output of the multiplier by N, N being the multiplication factor. The multiplication by N of a signal with a frequency $F_r$ and an initial phase $\phi_{0r}$ creates a transmission frequency $F_e=N*F_r$ and a phase rotation of $N*\phi_{0r}$.

It is therefore possible to obtain the signal at the frequency $F_e$ modulated by phase jumps $i*(2*\pi/m)$, if the signal at the frequency $F_r$ is modulated by phase jumps $i*(2*\pi/m)/N$.

In this case, the phase jumps at the reference signal $F_r$ are equal to:

$$i \times \frac{2\pi/m}{N} \text{ with } i \in [0, \ldots, m-1], \text{ or} \quad (2)$$
$$\pm(2i+1) \times \frac{\pi/m}{N} \text{ with } i \in [0, \ldots, (m/2)-1],$$

Should the signal with the frequency $F_r$ results from a transposition of the signal at the frequency $F_m$, phase-modulated with a local oscillator $F_{ol}$, the phase modulation of the signal $F_m$ is identical to the phase modulation of the signal $F_r$. Following transposition, the frequency $F_r$ is equal to $(F_{ol}+F_m)$ or $(F_{ol}-F_m)$ depending on the filtering used at output of the mixer making the transposition.

The phase jumps for the signal $F_m$ are therefore identical to the phase jumps for $F_r$ which are necessary to obtain the phase modulation $i*(2*\pi/m)$ desired at the antenna. These phase jumps therefore, at the level of the modulated signal $F_m$, are equal to:

$$i \times \frac{2\pi/m}{N} \text{ with } i \in [0, \ldots, m-1], \text{ or} \quad (3)$$
$$\pm(2i+1) \times \frac{\pi/m}{N} \text{ with } i \in [0, \ldots, (m/2)-1],$$

This modulation which makes it possible to obtain the phase modulation $i*(2*\pi/m)$ after multiplication by N is not the only one possible. In particular, if N is an odd number and greater than m−1, phase jumps of $i*(2*\pi/m)$ become phase jumps $N*i*(2*\pi/m)$ following multiplication by N: all the states modulo $2\pi$ are obtained following multiplication by N.

A phase modulation may be generated, for example, by a vector modulator which is used to sum two modulations that come from a same oscillator but are phase-shifted by $\pi/2$, from two modulating signals $m_I(t)$ and $m_Q(t)$ related to the message to be transmitted.

There are several devices used to obtain a modulation with phase jumps of the type $$i \times \frac{2\pi/m}{N} \text{ or } \pm(2i+1) \times \frac{\pi/m}{N}.$$

Hereinafter in the description, identical references designate similar elements.

Figure 2:
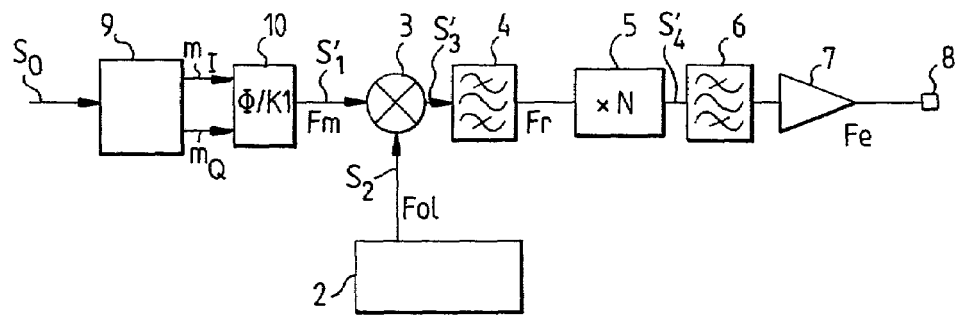
FIG. 2 shows a first structure of the transmission system according to the invention, including a useful signal divider.

FIG. 2 gives a schematic view of the structure of a transmitter according to the invention, comprising means used to divide the useful signal before multiplying it in a system as described in FIG. 1.

The transmitter comprises different elements which may be grouped into two blocks I and II. The first block I has the function especially of modulating and dividing the signal to be transmitted while the block II has the function of multiplying and amplifying the divided and transposed signal $S'_3$ before it is transmitted. The two blocks may form part of one and the same device or be distinct.

The binary message $S_0$ to be transmitted is first of all subdivided into two elementary modulating signals $m_Q$ and $m_I$ by applying a formant (t) function 9. A formant function (t) corresponds to an elementary relationship by which it is possible to pass from one state to another. This function is defined on the duration of a bit of the signal $S_0$ and its amplitude is standardized at 1. This can be applied, of course, to digital or analog messages.

The elementary modulating signals are then transmitted to a vector modulator 10 integrating a phase divider with a coefficient $K_1$.

The modulating signals $m_I$ and $m_Q$ linked to the message to be transmitted are such that (5):

$$m_e + jm_Q = 1 \times \exp\left(j \pm (2i+1) \times \frac{\pi/m}{K_1}\right)$$

with $K_1=N$ or $K_1$ substantially equal to N with N being the factor of multiplication that is an even or odd whole number.

Figure 3:
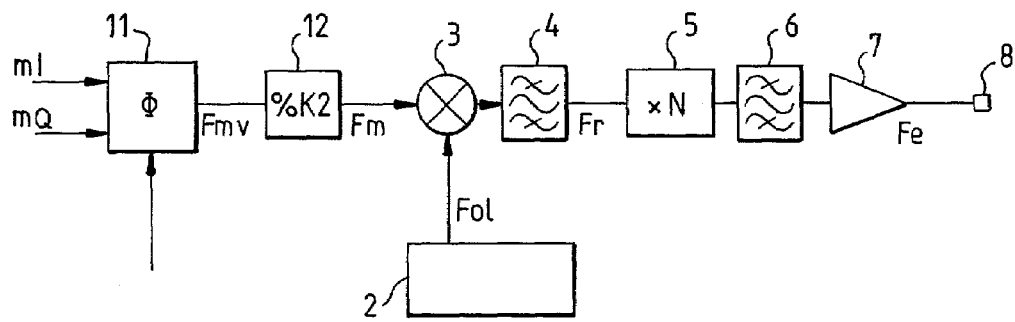
FIG. 3 shows a second structure of a transmission system.

FIG. 3 gives a schematic view of a second alternative embodiment of a device enabling this same modulation. In this case, the vector modulator 11 is associated with a frequency divider 12 placed between this modulator and the transposition mixer 3. This frequency divider 12 divides the useful signal having a frequency $F_{mv}$ at output of the vector modulator 11 by a coefficient $K_2$ equal or substantially equal to N, and then carries out the operation of mixing with the frequency $F_{ol}$ coming from the local oscillator and then the multiplication by N. The modulating signals $m_I$ and $m_Q$ related to the message to be transmitted are determined from the expression (5) with $K_1=1$.

The division by $K_2$ of a signal with a frequency $F_{mv}$ and an initial phase $\phi_{mv}$ creates a modulation frequency $F_m=F_{mv}/K_2$ and a phase rotation of $\phi_{mv}/K_2$ For certain modulations, the use of a frequency divider not integrated into the modulator is the cause of dissymmetry in the frequency spectrum. This dissymmetry is expressed especially by a shift in the frequency from its origin value and/or a dissymmetry in the minor lobes of the spectrum.

To compensate for these defects, the transmission system may comprise a device adapted to the generation of a random sense of phase rotation to go from one state to another and/or adapted to determining the formants used to optimize the transitions between the logic states and prevent dissymmetry in the minor lobes.

The result thereof is an optimization of the transitions between the logic states and the passages between the different states throughout the constellation of the states of the modulation used and a sense of rotation that is not always identical. The use of a random sense of rotation can be used especially to re-center the frequency.

The sense of phase rotation to meet the different points of the constellation of the phase states is determined for example randomly by a data preceding method.

The formant function used to go from one state to another is such that the paths and the senses of phase rotation taken to go to the different points of the constellation chosen are distributed randomly between the different states in order to obtain the most symmetrical spectrum possible after a frequency division and frequency multiplication.

The path is determined to modify the power spectral density in order especially to reduce the level of the minor lobes of the spectral density of the transmitted signal.

The sense of phase rotation is determined by random draw after the path to be traveled has been determined.

This can be applied especially to BPSK or QPSK modulations or again for any other modulation generating dissymmetry in the spectrum of the frequencies.

Figure 4:
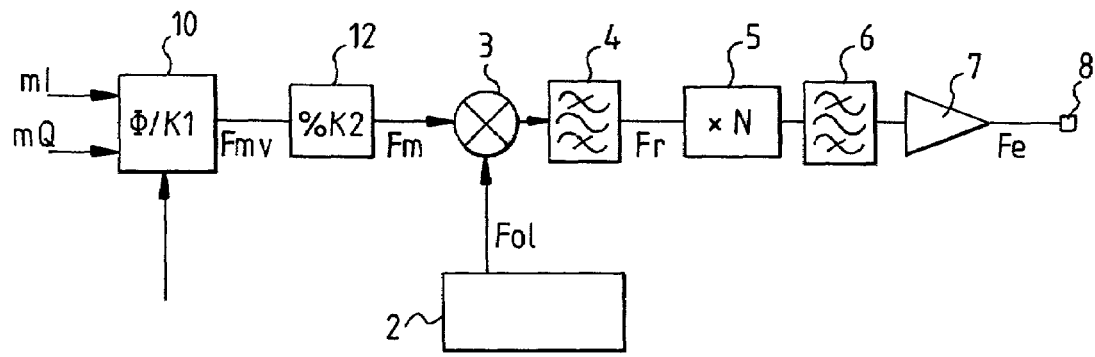
FIG. 4 shows an alternative embodiment combining the structures of FIGS. 2 and 3, FIGS. 5 to 12 show exemplary signals and spectra obtained with the structure according to the invention.

FIG. 4 gives a schematic view of a third alternative embodiment of a transmitter structure enabling this same modulation by a mixing of the two alternative embodiments described in FIGS. 2 and 3. In this case, the phase division is distributed between the phase divider $K_1$ integrated into the vector modulator 10 and a frequency divider $K_2$ placed between the vector modulator 10 and the transposition mixer 3: the division factors $K_1$ and $K_2$ are chosen so that $K_1 * K_2 = N$, the multiplication factor of the frequency multiplier. In this case, we truly obtain a phase modulation equal to $\phi_m/N$.

In practice, in all the exemplary embodiments mentioned here above, the frequency divider may be made by logic circuits based on flip-flop circuits used for the storage and therefore for the counting of the passages through zero of the signal at its input. The divider divides the phase information but generally loses the information on amplitude modulation because it processes only transitions. To overcome this drawback, which leads to a transformation of the initial modulation before division, it is possible to use a vector modulator adapted to the generation of a constant amplitude modulation.

The method implemented in a transmitter may comprise the following steps:

1) applying a formant to the binary message to be transmitted in order to obtain to elementary modulating signals $m_Q$ and $m_I$, 2) dividing the modulator signal by a coefficient K equal or substantially equal to the multiplication coefficient N used further below in the transmission system, 3) transposing the frequency signal by means of the frequency $F_{ol}$ of the oscillator, 4) multiplying the frequency-transposed signal by the multiplier coefficient N, 5) transmitting the signal after amplification to the required transmission level The modulation and division steps can be carried out of the same time.

Exemplary Application in the Framework of a BPSK Type Modulation

In the case of a two-phase-state BPSK type modulation, the division of the modulating signal by a factor $K_2=2$, introduces a constellation with four phase states at output of the divider. The BPSK modulation has a two-phase-state constellation: the division by $K_2=2$ introduces a phase ambiguity equal to $\pi(2\pi/K_2)$. This ambiguity is lifted after the multiplication by 2. In practice, this division leads to a dissymmetry in the power spectral density of the useful signal that is inherent in the distribution of the transitions between the states of the initial constellation.

Should the BPSK modulation divided by $K_2$ be done directly by the vector modulator, the modulation may generate a constellation with 2 phase states, for example $\exp(+j(\pi/2)/K_2)$ and $\exp(-j(\pi/2)/K_2)$. This modulation has a power spectral density of the $\sin(x)/x$ type symmetrical with respect to the carrier with a line at the frequency of the carrier.

Should the BPSK modulation be done by the vector modulator and the frequency division by a digital divider $K_2$, the modulator manages a constellation with two phase states for example $\exp(+j\ (\pi/4))$ and $\exp(-j\ (3\pi/4))$. The division by $K_2=2$ has the effect of creating a constellation with four phase states corresponding for example to the point $\exp(+j\ (\pi/4))$, $\exp(-j\ (\pi/4))$, $\exp(+j\ (3\pi/4))$ and $\exp(-j\ (3\pi/4))$. The phase modulation with phase jumps of $+/-i^*\pi/2$, thus made, has a dissymmetry related to the non-random character of the inter-state transitions: a dissymmetry of the power spectral density with respect to its center frequency and a shifting of the center frequency of the spectrum.

The dissymmetry of the power spectral density is related to the physical impossibility of obtaining a perfect BPSK phase modulation. To go from one point of the constellation to another, the BPSK modulator will impose a sense of phase rotation corresponding to the passage from the point at $+\pi/4$ to the point at $-3\pi/4$ and a phase rotation sense corresponding to the passage from the point at $-3\pi/4$ to the point $+\pi/4$: in practice, the constellation cannot be perfectly zero; the "zero" point cannot be reached.

If we consider a BPSK modulation made from a perfect modulator vector associated with one and the same message on both modulation channels, namely the I and Q channels, the introduction of a different filtering operation between the I and Q channels will give rise to a sense of rotation to go from one point of the constellation to another. This rotational sense is identical between the two states, but the fact of transposing the filters causes a change in the sense of rotation to go from one point to another in the constellation.

Figure 5:
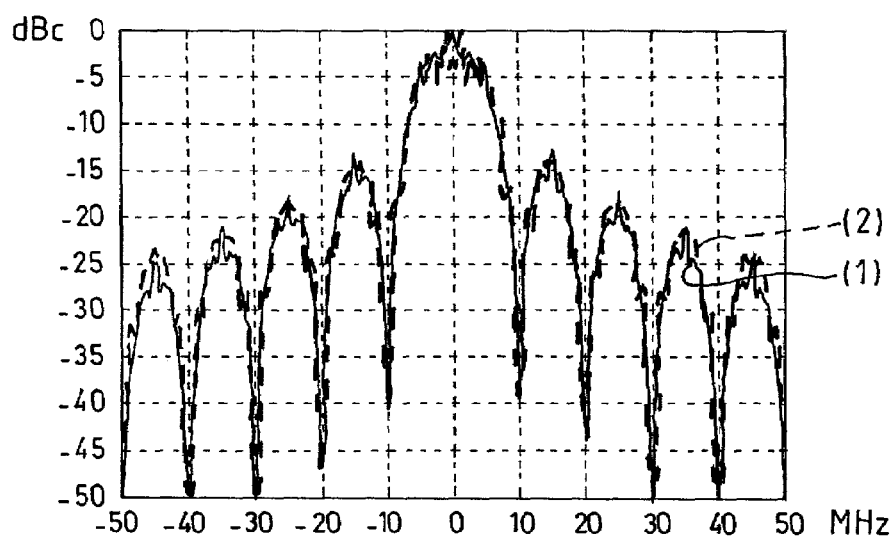
Figure 6:
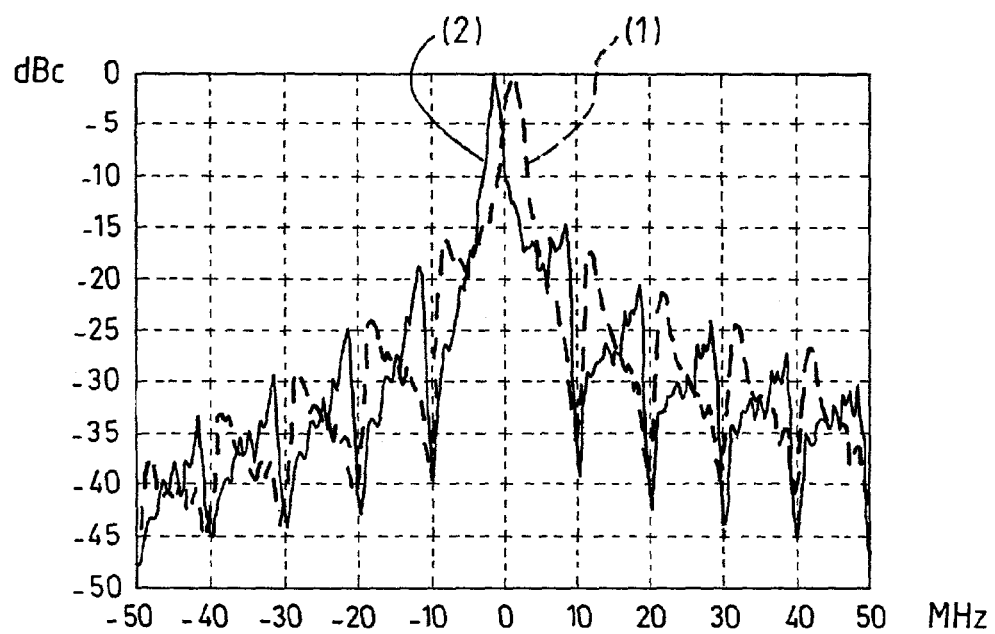

By way of an example, FIGS. 5 and 6 respectively give the shapes of the spectra of the BPSK modulating signal before and after division by 2 as a function of the filtering operations carried out on the I and Q signals of the vector modulator.

These curves are plotted in a spectral density graph expressed in dBc as a function of the frequency $F_m$ related to its carrier in MHz. They are obtained under the following conditions:

FIG. 5:

General Simulation Parameters:
  rough BPSK modulation (I=Q without formant)
  random binary message 10 Mbits per second on carrier at 200 MHz
  center frequency 200 MHz and sampling frequency 4 GHz Parameters of the Curves:
  curve 1: baseband filtering 50 MHz I channel and 100 MHz Q channel
  curve 2: baseband filtering 100 MHz I channel and 50 MHz Q channel

FIG. 6:

General Simulation Parameters
  rough BPSK modulation (I=Q) after frequency divider K2=2
  random binary message 10 Mbits per second on carrier at 200 MHz
  center frequency 100 MHz and sampling frequency 4 GHz Parameters of the Curves:
  curve 1: baseband filtering 50 MHz I channel and 100 MHz Q channel
  curve 2: baseband filtering 100 MHz I channel and 50 MHz channel The power spectral density after division has discontinuities at frequencies which are multiples of the bit rate. These discontinuities change direction according to the sense of rotation of the constellation.

The fact of keeping the same rotational sense to go from one state to another leads to a shift in the frequency of the spectrum. This shift in frequency depends on the nature of the message and, more particularly, on the mean number of transitions between states. The maximum frequency shift corresponds to a message in which the two logic states are alternated: in this case, the phase of the modulating signal rotates by $\pi$ radians per bit with respect to the carrier and, therefore, the shift in frequency is equal to:

$$\Delta F = (1/2\pi)^*(\Delta\Phi/\Delta t)/N = (\text{Fbit rate}/2)/N.$$

Figure 7:
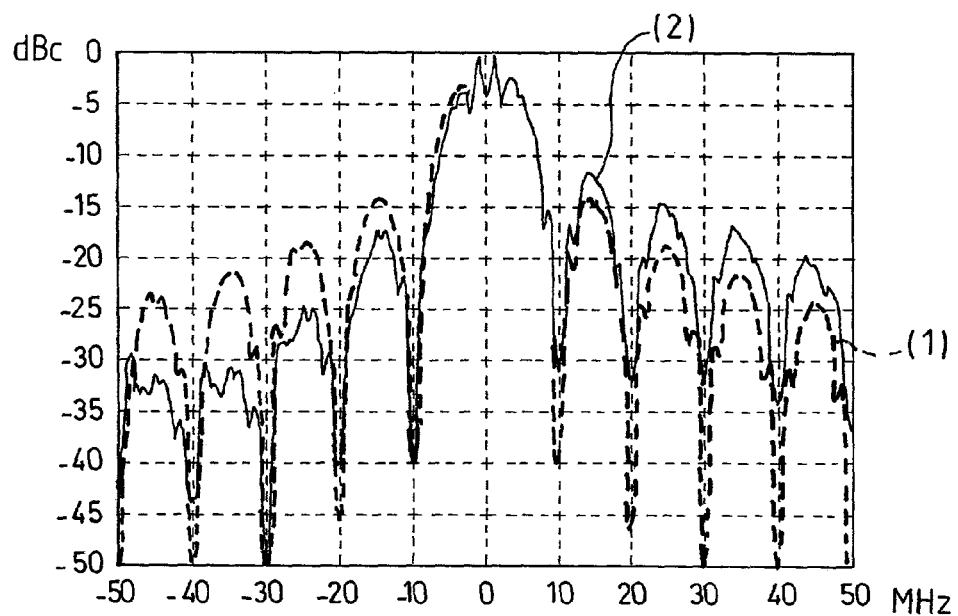

FIG. 7 shows the shape of the spectrum of the initial BPSK modulation and of the spectrum after division by 2 and multiplication by 2 for a value of filtering of the I and Q modulation channels.

Conditions for obtaining the curves of FIG. 7:

General Simulation Parameters:
  rough BPSK modulation I=Q but baseband filtering 100 MHz I channel and 50 MHz Q channel
  random binary message 10 Mbits per second on carrier at 200 MHz
  center frequency 200 MHz and sampling frequency 4 GHz Parameters of the Curves
  curve 1: initial BPSK modulation at output of the vector modulator
  curve 2: BPSK modulation after divider by 2 and multiplier by 2

A dissymmetry is observed essentially between the minor lobes but, on the whole, the spectrum is centered on the carrier frequency.

To make the spectrum of the modulation more symmetrical at output of the divider and therefore more symmetrical at output of the multiplier, the transitions between the logic states must be optimized and it must be ensured that the passages between the different states are all made on the constellation and that the phase rotation sense is not always identical.

In the case of a BPSK modulation, the fact of choosing a different sense of rotation for the passage between the two states symmetrizes the divided spectrum (identical path to go from one point to another but with a different rotational sense). However, lines appear at the frequencies that are multiples of the bit rate (with respect to the carrier). To eliminate these lines that are multiples of the bit rate, the direction of the passage from one state to another must be randomly distributed.

Improving the symmetry of the power spectral density of a modulation made by a frequency division followed by a frequency multiplication therefore relies on an equiprobable distribution of the two senses of phase rotation to go from one state to another: the paths between the states are, of course, symmetrical.

For certain phase modulations, where there is for example a pre-coding of the data before the modulator, these conditions may be fulfilled. For other modulations such as the BPSK or QPSK modulations, the sense of the phase rotation for a jump equal to $\pi$ depends on the dissymmetries of the modulator, and it is always identical.

Dictating a path, to go from one point of the constellation to another, amounts to filtering the modulating signal and therefore to filtering the spectral density of the initial modulation. If this filtering does not affect the amplitude of the modulated signal, the modulation coming from the vector modulator is preserved throughout the transmission system, even if the system comprises, as in the present case, a frequency divider, a frequency multiplier or a saturated amplifier.

To obtain a modulated signal with a constant amplitude, it is enough for the modulating signals $m_I(t)$ and $m_Q(t)$ to verify the relationship $|m_I(t)+jm_Q(t)|=1$ at each instant. This corresponds to a phase or frequency modulation $\phi_{0m}(t)$ such that $m_I(t)+jm_Q(t)=\exp(+j\phi_m(t))$. From the viewpoint of the constellation, the fact of generating a signal at constant amplitude amounts to moving in a circle. The choice of the filtering amounts to determining a relationship, as a function of time, of the phase of the modulating signal.

In the case of the above-mentioned example of BPSK modulation, exemplary phase relationships used to modify the spectral congestion of the modulation and symmetrize the spectral density once divided are given here below.

For these examples, the sense of the phase rotation between two states is determined by comparing the current state with the preceding state and by choosing the sense of the phase rotation between the states by random draw.

For a BPSK modulation, table 1 gives the phase relationship on the duration of a bit as a function of the state of this bit $X_k$ and of the previous bit $X_{k-1}$, the result of the random draw $TA_k$ as well as the formant of the formant(t) modulating signal. The formant(t) function corresponds to the elementary phase relationships used to pass from one state to another. It is defined according to the duration of one bit and its amplitude is standardized at 1, it being known that, in the case of a BPSK modulation, the phase variation on one bit is equal to $\pi$ radians.

TABLE 1

The different phase states of a BPSK modulation with formant and random sense of phase rotation.

| Current bit $X_k$ | Preceding bit $X_{k-1}$ | Result of random draw $TA_k$ | Phase $\Phi_{0m}$ of the modulating signal on the duration of the bit $t \in [t_k, t_{k+1}]$ | Shape of the phase on the duration of the bit |
|---|---|---|---|---|
| 0 | 0 | 0 or 1 | $\Phi_k(t) = \Phi_{k-1}(t = Tbit) = 0$ | Constant phase |
| 0 | 1 | 0 | $\Phi_k(t) = +\pi * \text{formant}(t)$ | Transition 0 at $\pi$ |
| 0 | 1 | 1 | $\Phi_k(t) = -\pi * \text{formant}(t)$ | Transition 0 at $-\pi$ |
| 1 | 1 | 0 or 1 | $\Phi_k(t) = \Phi_{k-1}(t = Tbit) = \pi$ or $-\pi$ | Constant phase |
| 1 | 0 | 0 | $\Phi_k(t) = +\pi * [1 - \text{formant}(t)]$ | Transition $\pi$ at 0 |
| 1 | 0 | 1 | $\Phi_k(t) = -\pi * [1 - \text{formant}(t)]$ | Transition $-\pi$ at 0 |

Figure 8:
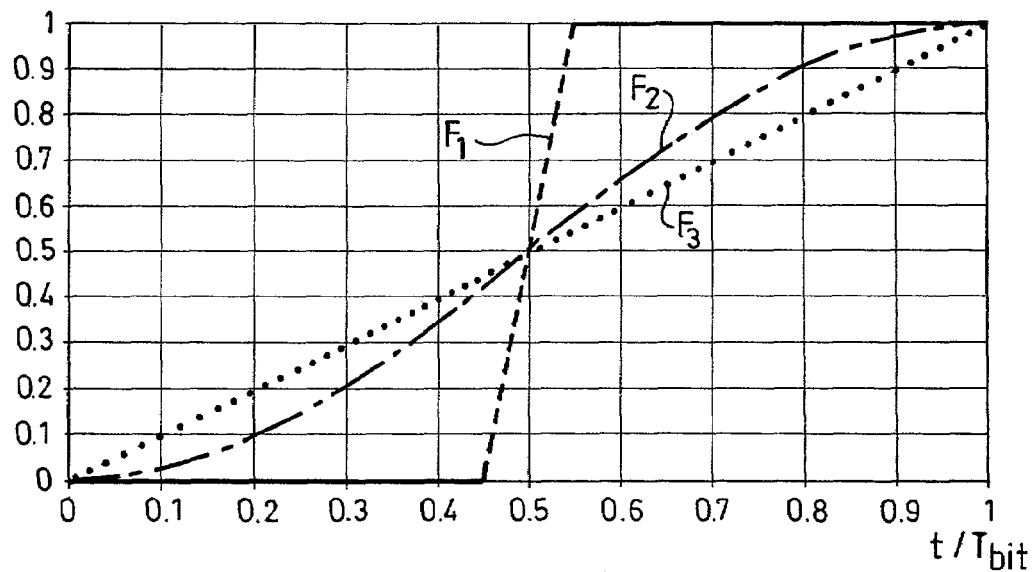

FIG. 8 gives a view, by way of an illustration, of three types of formant: a "rising time" type of formant $F_1$, a cosine type of formant $F_2$ and a "linear phase" type of formant $F_3$. The temporal expressions of these formants are given in the table 2.

TABLE 2

Expressions of possible formants for the BPSK modulation

| Type of formant | Expression of the formant as a function of $x = t/Tbit$ | |
|---|---|---|
| 1st case: "rising time" type formant | $\text{Formant}(x) = 0$ | for $x \in [0, (1 - x_m)/2]$ |
| | $\text{Formant}(x) = (1/x_m) * [x - (1 - x_m)/2]$ | for $x \in [(1- x_m)/2, (1 + x_m)/2]$ |
| | $\text{Formant}(x) = 1$ | for $x \in [(1 + x_m)/2, 1]$ with $x_m$ = rising time/Tbit |
| 2nd case: "cosine" type formant | $\text{Formant}(x) = (\frac{1}{2})*[1 - \cos(\pi x)]$ | for $x \in [0, \frac{1}{2}]$ |
| | $\text{Formant}(x) = (\frac{1}{2})*[1 + \cos(\pi(1 - x))]$ | for $x \in [\frac{1}{2}, 1]$ |
| 3rd case: "linear phase" type formant | $\text{Formant}(x) = x$ | for $x \in [0,1]$ |

Figure 9:
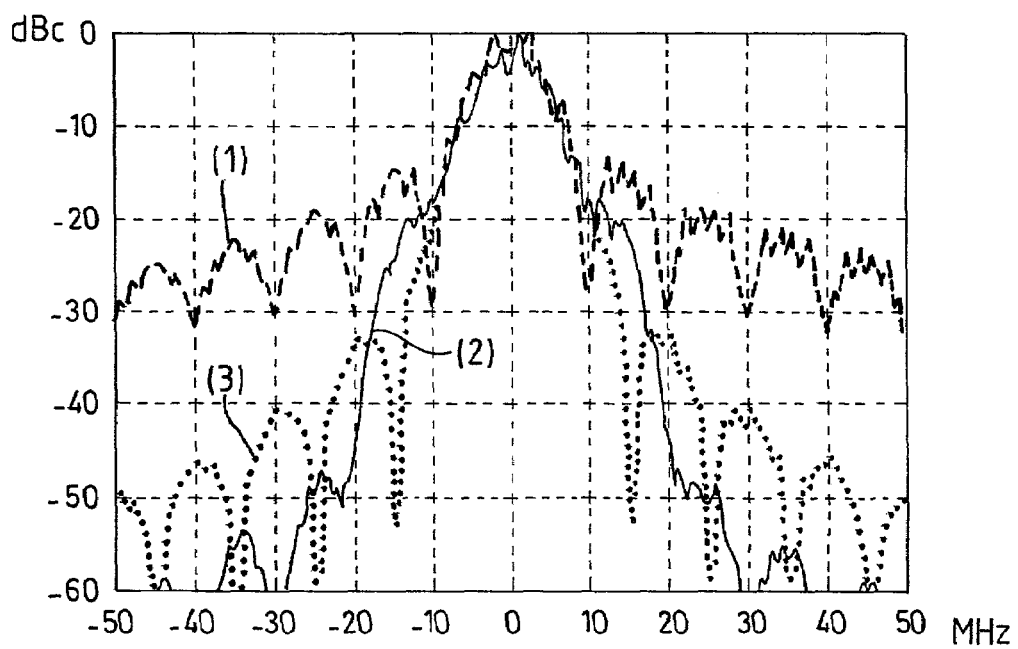

FIG. 9 gives the shape of the spectra of the BPSK modulation obtained by simulation for all three types of formants presented. The choice of a formant on the phase modulation significantly reduces the level of the distant minor lobes.

Figure 10:
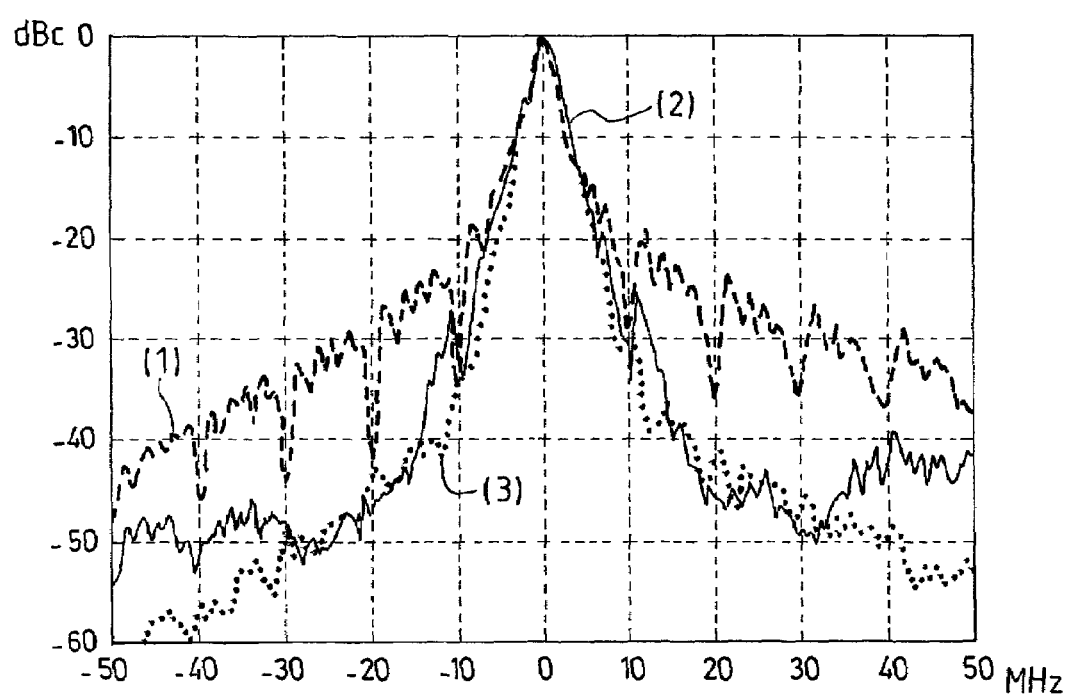

Conditions in which the curves of FIG. 9 are obtained:

General Simulation Parameters:
 BPSK modulation with formant
 random binary message 10 Mbits per second on carrier at 200 MHz
 center frequency 200 MHz and sampling frequency 4 GHz Parameters of the Curves
 curve 1: BPSK modulation with "rising time" type formant (Tm=10%)
 curve 2: BPSK modulation with "cosine" type formant
 curve 3: BPSK modulation with "linear phase" type formant FIG. 10 gives the shape of the spectra of the BPSK modulation after division by 2 for all three types of formants presented. The introduction of the random draw for the sense of the phase rotation gives a better symmetry of the spectral density and a center frequency after division equal to the carrier frequency without modulation (at output of the divider).

Conditions in which the curves of FIG. 10 are obtained:

General Simulation Parameters:
 BPSK modulation with formant
 random binary message 10 Mbits per second on carrier at 200 MHz
 center frequency 200 MHz and sampling frequency 4 GHz Parameters of the Curves
 curve 1: BPSK modulation with "rising time" type formant (Tm=10%)
 curve 2: BPSK modulation with "cosine" type formant
 curve 3: BPSK modulation with "linear phase" type formant FIG. 11 gives the shape of the spectra of the BPSK modulation after division by 2 and then multiplication by 2 for all three types of formants presented.

Figure 11:

Conditions in which the curves of FIG. 11 are obtained

Figure 12:
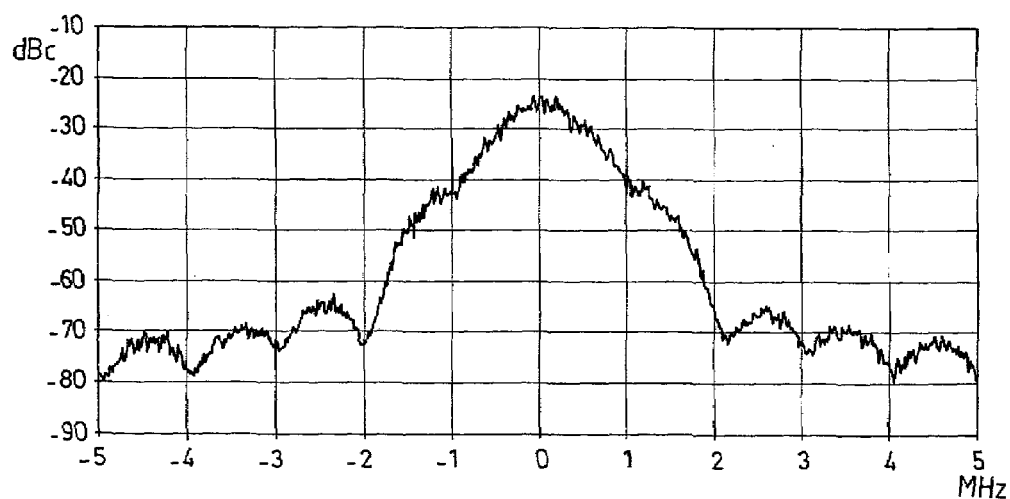

General Simulation Parameters:
 BPSK modulation with formant
 random binary message 10 Mbits per second on carrier at 200 MHz
 center frequency 200 MHz and sampling frequency 4 GHz Parameters of the Curves
 curve 1: BPSK modulation with "rising time" type formant (Tm=10%)
 curve 2: BPSK modulation with "cosine" type formant
 curve 3: BPSK modulation with "linear phase" type formant FIG. 12 gives the result of a spectral density obtained with a BPSK modulation with "cosine" type formant and a random draw of the sense of the phase rotation. In this embodiment, with a useful bit rate of 1 Mbits/s, the useful signal is generated by a modulator vector at 1890 MHz. It is divided by a frequency divider by $K_2=16$. Then, this signal is transposed by means of a local oscillator at Frf=2375 MHz to obtain a BPSK modulated signal filtered in the millimeter band after multiplication by N=16 and therefore at Fe=38 GHz.

What is claimed is:

1. A radiofrequency apparatus, comprising:
 at least one modulator configured to modulate, using a formant, a useful signal at a first frequency wherein the formant corresponds to the elementary phase relationships used to pass from one state to another;
 a device configured to divide the modulated signal by a first coefficient;
 a device configured to transpose the modulated and divided signal into a second frequency;
 a device configured to multiply the modulated, divided, and transposed signal by a second coefficient to obtain a signal at a transmission frequency; and a device configured to precode the useful signal, wherein a sense of phase rotation to meet different points of a constellation of phase states of the modulation is determined randomly.

2. The apparatus according to claim 1, wherein the modulator comprises an integrated divider.

3. The apparatus according to claim 1, wherein the divider is arranged after the modulator.

4. The apparatus according to claim 1, further comprising:
 a device configured to randomly generate the formant.

5. The apparatus according to claim 4, wherein the device for the generation of the formant is configured to produce a formant enabling the optimizing of phase states during the modulation of the useful signal and/or ensuring a random sense of phase rotation.

6. The apparatus according to claim 1, further comprising:
 a transposing device configured to transpose the frequency of the modulated and divided signals, the transposing device being arranged between the divider and the multiplier.

7. A method for the transmission of a useful signal, comprising:
 modulating, using a formant, the useful signal at a first frequency wherein the formant corresponds to the elementary phase relationships used to pass from one state to another;
 dividing the modulated useful signal by a first coefficient;
 transposing the modulated and divided signal into a second frequency; and
 multiplying the modulated, divided, and transposed signal by a second coefficient to obtain a signal at a transmission frequency, and the method further comprising precoding the useful signal, wherein a sense of phase rotation to meet different points of a constellation of phase states of the modulation is determined randomly.

8. The method according to claim 7, wherein paths and the sense of the phase rotation to go to the different points of the constellation are randomly distributed between the different states to obtain a most symmetrical possible spectrum after frequency division and frequency multiplication.

9. The method according to claim 7, wherein a path is determined to modify a power spectral density so as to reduce a level of minor lobes of the spectral density of the useful signal.

10. The method according to the claim 7, wherein the sense of phase rotation is determined randomly after a path to be taken has been determined.

11. The method according to claim 7, wherein the modulating step comprises:

modulating the useful signal by a vector modulator enabling modulation at constant amplitude.

12. The method according to claim 7, wherein the modulating step comprises:

modulating the useful signal using BPSK or QPSK type modulation.

* * * * *